(12) United States Patent
Franceschini et al.

(10) Patent No.: US 8,463,985 B2
(45) Date of Patent: Jun. 11, 2013

(54) CONSTRAINED CODING TO REDUCE FLOATING GATE COUPLING IN NON-VOLATILE MEMORIES

(75) Inventors: Michele M. Franceschini, White Plains, NY (US); Ashish Jagmohan, Irvington, NY (US); Luis A. Lastras-Montano, Cortlandt Manor, NY (US); Mayank Sharma, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 516 days.

(21) Appl. No.: 12/751,197

(22) Filed: Mar. 31, 2010

(65) Prior Publication Data

US 2011/0246703 A1 Oct. 6, 2011

(51) Int. Cl.
*G06F 12/02* (2006.01)
*H03M 13/00* (2006.01)

(52) U.S. Cl.
USPC ............... 711/103; 714/763; 365/185.09

(58) Field of Classification Search
None
See application file for complete search history.

(56) References Cited

U.S. PATENT DOCUMENTS

| | | |
|---|---|---|
| 5,502,728 A | 3/1996 | Smith, III |
| 5,623,436 A | 4/1997 | Sowards et al. |
| 5,751,993 A | 5/1998 | Ofek et al. |
| 5,818,755 A | 10/1998 | Koyanagi et al. |
| 5,860,080 A | 1/1999 | James et al. |
| 5,867,429 A | 2/1999 | Chen et al. |
| 5,912,839 A | 6/1999 | Ovshinsky et al. |
| 5,987,570 A | 11/1999 | Hayes et al. |
| 6,009,547 A | 12/1999 | Jaquette et al. |
| 6,026,464 A | 2/2000 | Cohen |
| 6,040,993 A | 3/2000 | Chen et al. |
| 6,076,183 A | 6/2000 | Espie et al. |
| 6,222,762 B1 | 4/2001 | Guterman et al. |
| 6,226,723 B1 | 5/2001 | Gustavson et al. |
| 6,292,398 B1 | 9/2001 | Pasotti et al. |
| 6,292,903 B1 | 9/2001 | Coteus et al. |
| 6,301,151 B1 | 10/2001 | Engh et al. |
| 6,370,324 B1 * | 4/2002 | Kawahara et al. ............ 386/202 |
| 6,397,366 B1 | 5/2002 | Tanaka et al. |
| 6,415,363 B1 | 7/2002 | Benayoun et al. |
| 6,424,566 B1 | 7/2002 | Parker |
| 6,457,174 B1 | 9/2002 | Kuroda et al. |
| 6,473,879 B1 | 10/2002 | Ishii et al. |

(Continued)

FOREIGN PATENT DOCUMENTS

WO WO2006064497 A2 6/2006

OTHER PUBLICATIONS

Feng Qin et al.; "Exploiting ECC-Memory for Detecting Memory Leaks and Memory Corruption during Production Runs", 11th International Symposium on High-Performance Comptuer Architecture (HPCA-Nov. 2005), pp. 12.

(Continued)

*Primary Examiner* — Kaushikkumar Patel
(74) *Attorney, Agent, or Firm* — Cantor Colburn LLP; Dwayne Nelson (57) ABSTRACT

Constrained coding to reduce floating gate coupling in non-volatile memories including a method for storing data. The method includes receiving write data to be written to a flash memory device, selecting a codeword in response to the write data, and writing the codeword to the flash memory device. The codeword is selected to reduce floating gate coupling in the flash memory device by preventing specified symbol patterns from occurring in the codeword.

22 Claims, 8 Drawing Sheets

U.S. PATENT DOCUMENTS

| | | |
|---|---|---|
| 6,522,580 B2 | 2/2003 | Chen et al. |
| 6,570,784 B2 | 5/2003 | Lowrey |
| 6,728,826 B2 | 4/2004 | Kaki et al. |
| 6,748,561 B2 | 6/2004 | Prasad |
| 6,816,413 B2 | 11/2004 | Tanzawa |
| 6,870,773 B2 | 3/2005 | Noguchi et al. |
| 6,937,522 B2 | 8/2005 | Funaki |
| 6,970,382 B2 | 11/2005 | Toros et al. |
| 7,031,181 B1 | 4/2006 | Happ |
| 7,073,012 B2 | 7/2006 | Lee |
| 7,103,812 B1 | 9/2006 | Thompson et al. |
| 7,127,004 B1 | 10/2006 | Sonning et al. |
| 7,177,199 B2 | 2/2007 | Chen et al. |
| 7,180,771 B2 | 2/2007 | Cho et al. |
| 7,203,886 B2 | 4/2007 | Brown et al. |
| 7,292,466 B2 | 11/2007 | Nirschl |
| 7,301,817 B2 | 11/2007 | Li et al. |
| 7,305,596 B2 | 12/2007 | Noda et al. |
| 7,313,016 B2 | 12/2007 | Dodge et al. |
| 7,327,609 B2 | 2/2008 | Kim et al. |
| 7,352,624 B2 | 4/2008 | Roohparvar |
| 7,352,627 B2 | 4/2008 | Cohen |
| 7,355,237 B2 | 4/2008 | Lutze et al. |
| 7,362,615 B2 | 4/2008 | Pham et al. |
| 7,372,725 B2 | 5/2008 | Philipp et al. |
| 7,391,642 B2 | 6/2008 | Gordon et al. |
| 7,397,698 B2 | 7/2008 | Fong et al. |
| 7,430,639 B1 | 9/2008 | Bali et al. |
| 7,436,703 B2 | 10/2008 | Pham et al. |
| 7,440,315 B2 | 10/2008 | Lung |
| 7,447,948 B2 | 11/2008 | Galbi et al. |
| 7,471,559 B2 | 12/2008 | Shibata |
| 7,480,176 B2 | 1/2009 | Kamei |
| 7,542,336 B2 | 6/2009 | Han |
| 7,606,077 B2 | 10/2009 | Li et al. |
| 2002/0099996 A1 | 7/2002 | Demura et al. |
| 2003/0163776 A1 | 8/2003 | Prasad |
| 2004/0153902 A1* | 8/2004 | Machado et al. ............. 714/710 |
| 2005/0138276 A1 | 6/2005 | Navada et al. |
| 2005/0166006 A1 | 7/2005 | Talbot et al. |
| 2005/0190609 A1 | 9/2005 | Janssen et al. |
| 2005/0240745 A1 | 10/2005 | Lyer et al. |
| 2005/0251621 A1 | 11/2005 | Theis |
| 2006/0015780 A1 | 1/2006 | Fong |
| 2006/0090051 A1 | 4/2006 | Speier et al. |
| 2006/0155791 A1 | 7/2006 | Tene et al. |
| 2006/0179400 A1 | 8/2006 | Qian et al. |
| 2007/0153579 A1 | 7/2007 | Roohparvar et al. |
| 2007/0189065 A1 | 8/2007 | Suh et al. |
| 2008/0010581 A1 | 1/2008 | Alrod et al. |
| 2008/0025080 A1 | 1/2008 | Chan et al. |
| 2008/0034272 A1 | 2/2008 | Wu et al. |
| 2008/0052424 A1 | 2/2008 | Sameshima et al. |
| 2008/0114947 A1 | 5/2008 | Brox et al. |
| 2008/0151613 A1 | 6/2008 | Chao et al. |
| 2008/0158959 A1* | 7/2008 | Mokhlesi ................. 365/185.09 |
| 2008/0162858 A1 | 7/2008 | Moyer |
| 2008/0222368 A1 | 9/2008 | Gehrmann |
| 2008/0222491 A1 | 9/2008 | Lee et al. |
| 2008/0266991 A1 | 10/2008 | Lee et al. |
| 2008/0282106 A1 | 11/2008 | Shalvi et al. |
| 2009/0003044 A1 | 1/2009 | Happ et al. |
| 2009/0034324 A1 | 2/2009 | Kim et al. |
| 2009/0157994 A1 | 6/2009 | Hampel et al. |
| 2010/0020620 A1* | 1/2010 | Kim et al. ................. 365/185.24 |
| 2010/0034022 A1* | 2/2010 | Dutta et al. ............. 365/185.18 |
| 2010/0036997 A1 | 2/2010 | Brewer et al. |
| 2010/0125701 A1* | 5/2010 | Park ............................ 711/103 |
| 2010/0165730 A1* | 7/2010 | Sommer et al. ........... 365/185.03 |
| 2010/0202198 A1* | 8/2010 | Kim et al. ................. 365/185.03 |
| 2010/0223530 A1* | 9/2010 | Son et al. ...................... 714/763 |
| 2010/0241929 A1* | 9/2010 | Song et al. .................... 714/763 |
| 2011/0145504 A1 | 6/2011 | Anh et al. |
| 2011/0154160 A1* | 6/2011 | Yurzola et al. ................. 714/763 |
| 2011/0216586 A1* | 9/2011 | Graef et al. ............. 365/185.02 |

OTHER PUBLICATIONS

G. Novark et al.; "Exterminator: Automatically Correcting Memory Errors with High Probability"; PLDI'07; Jun. 11-13, 2007; San Diego, CA; Copyright 2007; 11 pages.

Ki-Tae Park et al., "A Zeroing Cell-to-Cell Interference Page Architecture with Temporary LSB Storing and Parallel MSB Program Scheme for MLC NAND Flash Memories," IEEE Journal of Solid-State Circuits, vol. 43, No. 4, Apr. 2008, pp. 919-928.

Noboru Shibata et al., "A 70 nm 16 Gb 1-Level-Cell NAND Flash Memory", IEEE Journal of Solid-State Circuits, vol. 43, No. 4, Apr. 2008, pp. 929-937.

* cited by examiner

| From State | To State | | | | | | |
|---|---|---|---|---|---|---|---|
|  | S0 | S1 | S2 | S3 | S4 | S5 | S6 |
| S0 | 3/7 | 1/5 | - | 2/6 | 0/4 | - | - |
| S1 | 7 | 1/5 | 3 | 6 | 0/4 | 2 | - |
| S2 | 3/7 | - | - | 2/6 | - | - | - |
| S3 | 3/7 | - | - | 2/6 | 0/4 | - | 1/5 |
| S4 | 7 | - | 3 | 6 | 0/4 | 2 | 1/5 |
| S5 | 3/7 | - | - | 2/6 | - | - | - |
| S6 | 7 | 1/5 | 3 | - | - | - | - |

CONSTRAINED CODING TO REDUCE FLOATING GATE COUPLING IN NON-VOLATILE MEMORIES

BACKGROUND

This present invention relates generally to computer memory, and more specifically to constrained coding to reduce floating gate coupling in non-volatile memories.

Phase-change memories (PCMs) and flash memories are examples of non-volatile memories with limited endurance (also referred to as a "limited life"). Such memories have limited endurance in the sense that after undergoing a number of writing cycles (RESET cycles for PCM, program/erase cycles for flash memory), the memory cells wear out and can no longer reliably store information.

Not-and (NAND) flash memories are widely used in contemporary memory systems due to their relatively low cost and high density. One source of errors in NAND flash memory is the capacitive coupling between adjacent floating gates that may cause cell-to-cell interference between adjacent cells in a NAND flash memory block. This type of potential error is of increasing importance with the increasing prominence of multi-level cells with increasing numbers of storage levels, and with the decreasing size of flash memory cells. Both the increasing number of storage levels and the decreasing size of flash memory cells improve storage density. As described in the article "A Zeroing Cell-to-Cell Interference Page Architecture with Temporary LSB Storing and Parallel MSB Program Scheme for MLC NAND Flash Memories" by Park et al., in the April 2008 IEE Journal of Solid-State Circuits, floating-gate coupling may be the dominant cause of errors for small multi-level cell (MLC) flash devices.

Contemporary flash memory controllers use error correction coding (ECC) to correct up to a certain number of bit errors per page. However, such ECC is limited, and can only correct a few bit errors per data block (for example, it may correct up to 12 bits per 512 bytes of data). Given the limitations on ECC, restrictions may be imposed on how writing to a NAND flash block may be performed. For example, MLC memories may restrict the user to sequential writing of pages in a block, with only one write allowed per page. Restrictions such as this can cause an increase in write latency, and can also cause write amplification. Write amplification adversely affects the lifetime of the flash device due to the wear caused by the additional program/erase cycles.

SUMMARY

An exemplary embodiment is a computer implemented method for storing data. The method includes receiving write data to be written to a flash memory device, selecting a codeword in response to the write data, and writing the codeword to the flash memory device. The codeword is selected to reduce floating gate coupling in the flash memory device by preventing specified symbol patterns from occurring in the codeword.

Another exemplary embodiment is a computer implemented method for storing data. The method includes receiving write data to be written to a flash memory device, where the flash memory device includes a plurality of pages characterized by a page length. The write data is compressed, resulting in compressed write data. A codeword is selected in response to the compressed write data. The codeword is selected to reduce floating gate coupling in the flash memory device by preventing specified symbol patterns from occurring in the codeword. A length of the codeword is determined. The codeword is written a page in the flash memory device in response to the length of the codeword being less than or equal to the page length.

A further exemplary embodiment is a system that includes a receiver for receiving write data to be written to a flash memory device, and encoder for selecting a codeword in response to the write data, and a flash write processor for writing the codeword to the memory device. The codeword selected by the encoder to reduce floating gate coupling in the flash memory device by preventing specified symbol patterns from occurring in the codeword.

Additional features and advantages are realized through the techniques of the present embodiment. Other embodiments and aspects are described herein and are considered a part of the claimed invention. For a better understanding of the invention with the advantages and features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Exemplary embodiments of the present invention provide a system and method for writing to a not-and (NAND) flash memory to reduce floating gate coupling. In an exemplary embodiment, data is converted to a (possibly two-dimensional) bit pattern in which certain sub-patterns are forcibly absent. The absent sub-patterns are selected to be the patterns that have a high possibility of inducing errors due to floating gate coupling. Exemplary embodiments do not require any changes to the hardware design of the memory. Exemplary embodiments simply require a memory controller that converts data to the desirable form, and this can be done by hardware and/or software. Thus, exemplary embodiments are very flexible, because they can be used with any NAND flash memory technology; all that is required is to simply change the data conversion such that the restricted sub-patterns are adapted to the flash memory being used.

Figure 1:
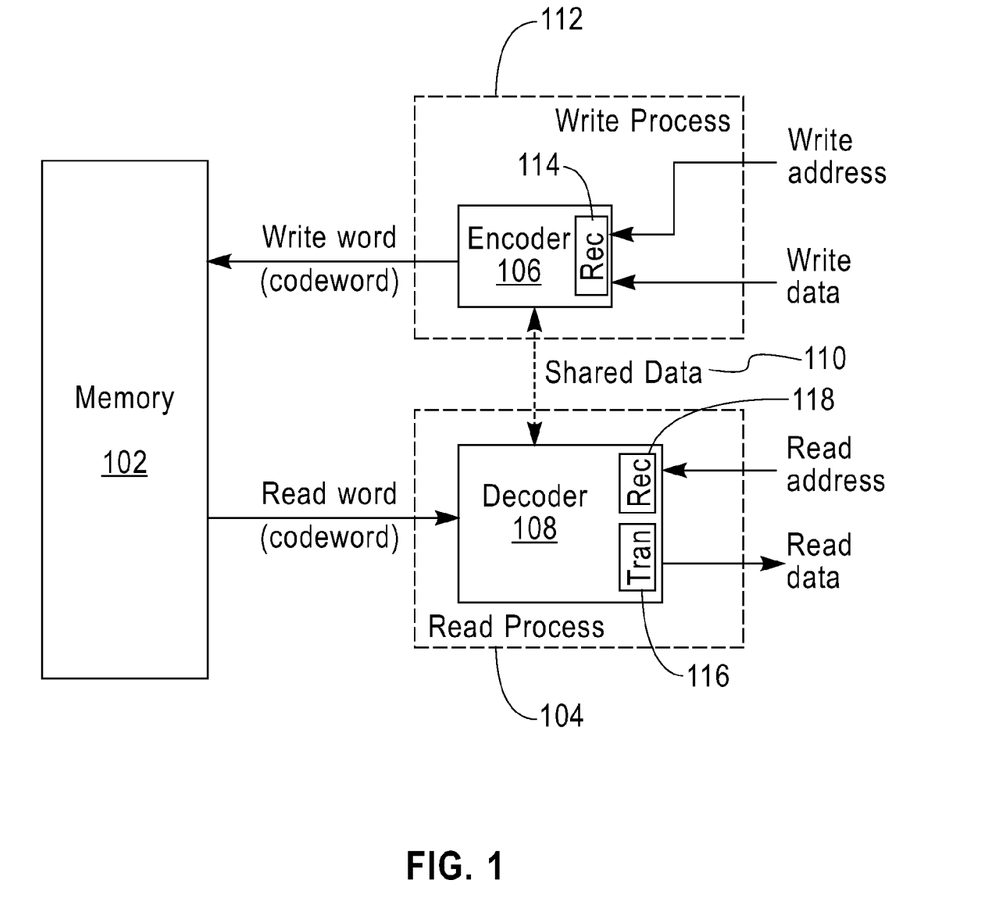
FIG. 1 illustrates a block diagram of a system for storing and retrieving data in a memory system that may be implemented by an exemplary embodiment.

FIG. 1 illustrates a block diagram of a system for storing and retrieving data in a memory that may be implemented by exemplary embodiments. The system depicted in FIG. 1 includes a memory 102 having blocks of memory cells (each block made up of pages), an encoder 106 for receiving write data and generating a write word for storage in the memory cells, a decoder 108 for receiving a read word from the memory and generating read data, and shared data 110 storing characteristics of the stored data (e.g., a mapping between a logical and physical address or a mapping between logical data and codewords) for use by both the encoder 106 and the decoder 108. In an exemplary embodiment, the encoder 106 and shared data 110 are utilized by a write process 112, and the decoder 108 and shared data 110 are utilized by a read process 104.

In an exemplary embodiment the encoder 106, decoder 108, and shared data 110 are located on a memory controller or memory module. In an alternate exemplary embodiment, the encoder 106, decoder 108, and shared data 110 are located on a memory device. The shared data 110 may be stored in a register or any other storage location that is accessible by both the encoder 106 and the decoder 108.

In an exemplary embodiment, the memory 102 is implemented by NAND flash memory devices or other non-volatile memory devices. In an exemplary embodiment, the memory 102 is implemented by a multi-level cell NAND flash memory device. In another exemplary embodiment, the memory 102 is implemented by a single level cell (SLC) NAND flash memory device.

Inputs to the encoder 106 depicted in FIG. 1 include the address of the page to be written (also referred to herein as a "write address"), and the data to be written to the page. In an exemplary embodiment, the inputs are received via a receiver 114 (e.g., located on the encoder 106, a memory device, memory module, memory controller, or other location). The receiver 114 may be implemented in a variety of manners including hardware for receiving the inputs and/or a storage location (e.g., a register) where the inputs are located.

An input to the decoder 108 depicted in FIG. 1 includes the address of the memory location (e.g., a page) to be read. In an exemplary embodiment, the input is received via a receiver 118 located on (e.g., located on a memory device, memory module, memory controller, the decoder 108, or other location). The receiver 118 may be implemented in a variety of manners including hardware for receiving the inputs and/or a storage location (e.g., a register) where the inputs are located.

An output from the decoder 108 depicted in FIG. 1 includes the read data. In an exemplary embodiment, the read data is output via a transmitter 116 (e.g., located on a memory device, memory module, memory controller, the decoder 108, or other location). The transmitter 116 may be implemented in a variety of manners including hardware for transmitting the output and a storage location or register where the outputs are stored. In an exemplary embodiment, the receiver 118 and the transmitter 116 are combined and implemented by a transceiver.

As used herein, the term "bit" refers to an element of an alphabet with two letters, conventionally the alphabet {0,1}. Also as used herein, the term "symbol" refers to an element from an alphabet with possibly more than two letters, thus a bit is a symbol. For example, in a 4-ary MLC flash, each cell can store one of four levels, labeled say {L0,L1,L2,L3}. Thus, a symbol may be an element of this 4-ary set. For both SLC and MLC flash, a symbol could also be formed by concatenating the values of multiple cells. For example, for SLC, each symbol could be formed by taking three consecutive single-bit cell locations and concatenating the binary data levels stored in these cells. Such a symbol would be an element of the set {000,001,010,011,100,101,110,111}. Exemplary embodiments described herein in terms of bits may be extended in other exemplary embodiments to symbols.

Figure 2:
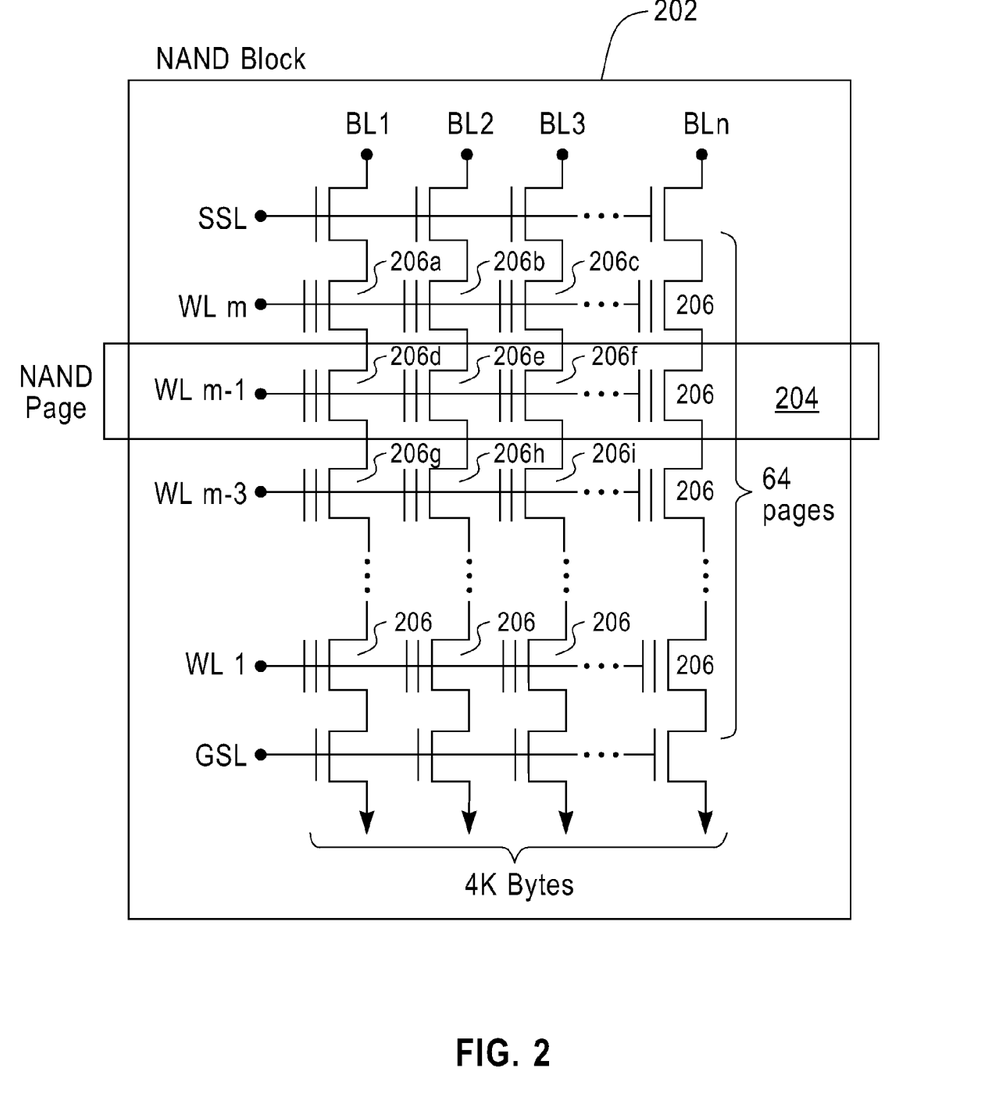
FIG. 2 illustrates a block diagram of a not-and (NAND) flash memory that may be implemented by an exemplary embodiment.

FIG. 2 illustrates a block diagram of a NAND flash memory that may be implemented by an exemplary embodiment. The NAND block 202 depicted in FIG. 2 includes a plurality of pages 204, with each page made up of a plurality of memory cells 206 (each including a floating gate and a control gate). In the example depicted in FIG. 2, sixty-four pages make up the block 202, however other numbers of pages may also make up one block of NAND memory (e.g., one hundred and twenty eight, and thirty two). In the example depicted in FIG. 2, each page is made up of thirty four thousand five hundred and twelve memory cells (of which 4096*8 cells are designated as a 4 Kilobyte (KB) data storage area, and the rest constitute a spare area), however other numbers of memory cells may make up one page of NAND memory (e.g., the data storage area may be 2 KB or 8 KB).

FIG. 2 includes a plurality of bit lines (denoted "BL1", "BL2", "BLn"), a plurality of word lines (denoted "WL1" and "WLm"), a ground selection line (GSL), and a source selection line (SSL). As shown in FIG. 2, memory cells 206 within a page 204 share word lines and are programmed simultaneously. Additionally, for an MLC device, each page may consist of a given bitplane from a row of cells. For example, one page may consist of the least significant bits of a row of cells, while another may consist of the most significant bits of a row of cells.

In a typical flash device, a mapping between physical and logical block addresses is maintained in the controller. Given a logical address and data for a write, the controller selects a physical page to write the data onto and records the logical-to-physical mapping. A typical example is the use of a log based file system (LBFS) where the physical page is the next erased page in the block to which the last logical page was written to, wherein the pages are sequenced, for example on the basis of proximity to the GSL.

In NAND flash memory, pages are the smallest write units and blocks are the smallest erase units. In an exemplary embodiment, the NAND flash memory has two-level cells (called single-level cell or "SLC" NAND flash, since there is only a single programmed level), and once a memory cell is programmed (e.g., changed from a "1" to a "0"), it cannot be changed until the entire block is erased. In this exemplary embodiment, erasing results in all memory cells in the block having a value of "1".

In another exemplary embodiment the NAND flash memory has multi-level cells supporting more than two-levels (called multi-level cell or "MLC" NAND flash). For example, a four MLC memory may consist of cells capable of storing four levels. Each of the four levels may be denoted by a two-bit string, say, levels {11, 10, 01, 00} in order of increasing floating-gate charge, where the level "11" represents the erased state and level '00' the highest charge. In this example, level "11" corresponds to programmed charge level zero (L0), "10" to level one (L1), "01" to level two (L2), and "00" to level three (L3).

As depicted in FIG. 2, capacitive coupling may occur between the floating gates of adjacent memory cells 206. For example, the floating gate of memory cell 206e is coupled to the floating gates of memory cells 206 that are adjacent to memory cell 206e. Memory cells 206 adjacent to memory cell 206e include: memory cell 206b, memory cell 206d, memory cell 206f, and memory cell 206h. The threshold voltage of memory cell 206e changes with a change in the threshold voltage of its adjacent memory cells. In general, the voltage shift of a memory cell 206, such as memory cell 206e, is linearly proportional to floating gate voltage shift in memory cells 206 that are adjacent to the memory cell 206. Further, the larger the programmed charge level (e.g., voltage), of a memory cell 206, the higher the floating gate coupling voltage shift induced in the adjacent memory cells 206. Such a voltage shift may cause errors in the stored data by causing the cell to be read at a different level than the originally programmed voltage level In an example case, where the memory is a MLC memory, if memory cells 206e has a programmed charge level of L1, then memory cell 206e has a maximum floating gate coupling shift if all of its neighboring cells (memory cell 206a, memory cell 206b, memory cell 206c, memory cell 206d, memory cell 206f, memory cell 206g, memory cell 206h and memory cell 206i) have a charge level of L3. In this example, a write pattern where memory cell 206a has a value of L1 and all its neighboring cells have a value of L3 may be flagged as a forbidden write pattern. As used herein, the term "forbidden write pattern" refers to a data pattern that has a high probability of inducing errors due to floating gate coupling. In exemplary embodiments, constrained coding is applied to write data prior to writing to memory 102 to reduce (or eliminate) the possibility of the forbidden write patterns being written to memory 102.

Another example of a prohibited sub-pattern (also referred to herein as forbidden patterns) is one where for each memory cell 206 that has a particular level (e.g., L1) written, every n-neighborhood of the memory cell 206 may have no more than a certain number of each higher level (e.g., L2, L3). For example, in a four MLC memory, each cell that has the lowest programmed level L1 written may be restricted to being surrounded by no more than five L3s being written in an eight neighborhood. Thus, as depicted in FIG. 2, if memory cell 206e is an L1, then no more than five of memory cell 206a, memory cell 206b, memory cell 206c, memory cell 206d, memory cell 206f, memory cell 206g, memory cell 206h and memory cell 206i may contain an L3.

A further example of a forbidden pattern is that in a four MLC memory, the two by three pattern [x, L3, x; L3, L1, L3] may be forbidden as there is a large chance that the coupling between the middle L1 cell and the horizontal and vertical L3 cells may induce an error with a relatively high probability. Referring back FIG. 2, if memory cell 206e has a value of L1, then memory cell 206b, memory cell 206d, and memory cell 206f may not all have a value of L3.

Other forbidden patterns may be implemented by exemplary embodiments based, with forbidden patterns being selected based on criteria such as, but not limited to, properties of the specific memories being utilized, usage conditions such as desired retention time, and environmental conditions. The forbidden patterns described herein are examples of just a few forbidden patterns that may be implemented by exemplary embodiments.

Figure 3:
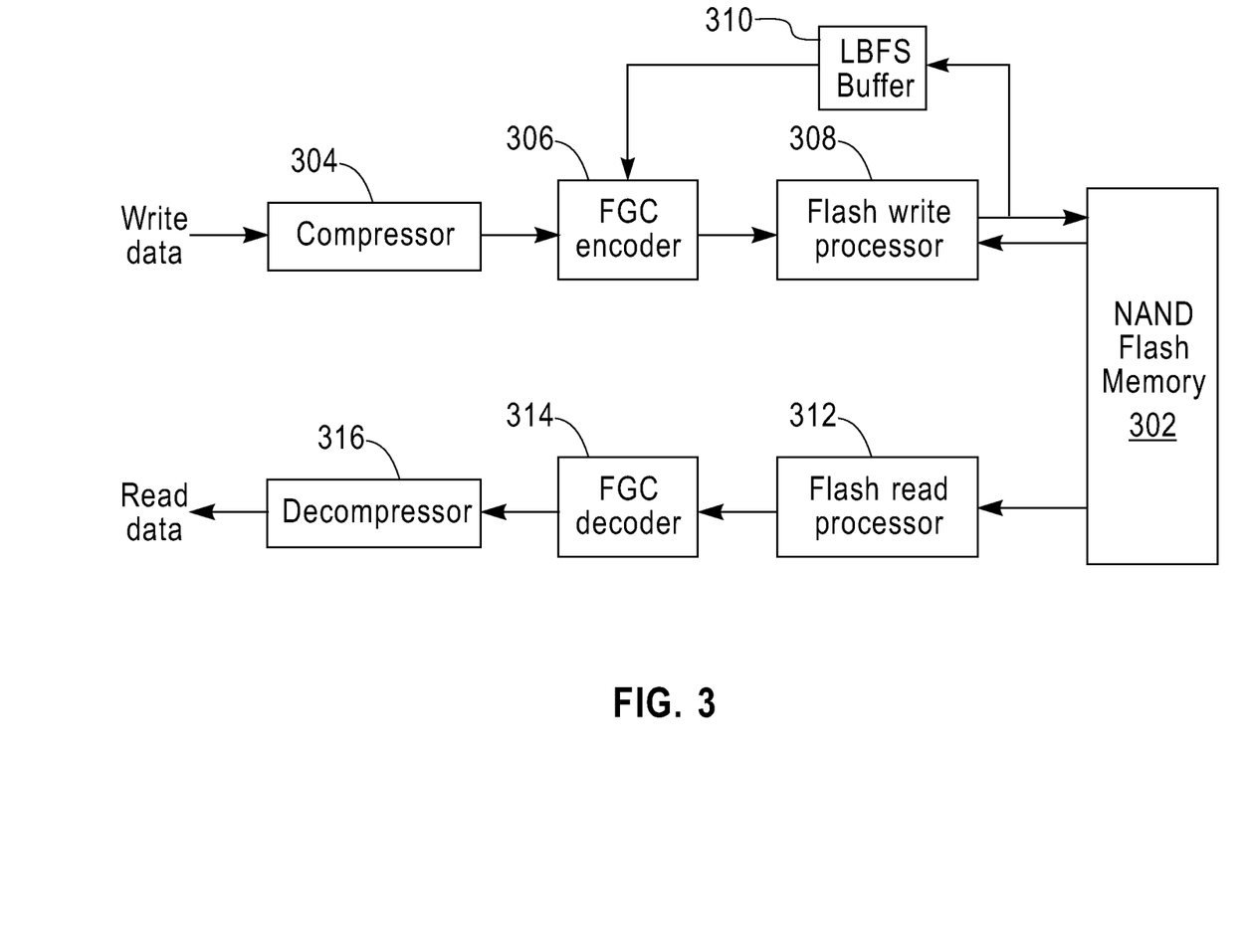
FIG. 3 illustrates a system for storing data in a NAND flash memory in a manner that reduces errors caused by floating gate coupling that may be implemented by an exemplary embodiment.

FIG. 3 illustrates a system for storing data in a NAND flash memory in a manner that reduces errors caused by floating gate coupling that may be implemented by an exemplary embodiment. In an exemplary embodiment, the system depicted in FIG. 3 is implemented by the encoder 106 and decoder 108 depicted in FIG. 1.

As shown in FIG. 3, write data is input to a data compressor 304. In an exemplary embodiment, the data compressor 304 applies a lossless data compression algorithm to compress the write data. Examples of lossless data compression algorithms that may be implemented include, but are not limited to: arithmetic coding, Huffman coding, Lempel-Ziv coding, and Burrows-Wheeler transform (BWT) coding. In addition, if characteristics (such as statistics) of the write data are known a-priori or are predictable, any specialized lossless coding algorithm may be applied which exploits this knowledge in order to compress the data more effectively. In an alternate exemplary embodiment, the system does not include the compressor 304 and the write data is input directly into the floating gate coupling encoder 306.

The output of the compressor 304 is input to the floating gate coupling encoder 306 to generate a codeword (i.e., to convert the compressed write data into a codeword) to be written to the memory 302. Also input to the floating gate coupling encoder 306 is data stored in the log based file system (LBFS) buffer 310. Contents of the LBFS buffer 310 include one or more of the previously written pages in the memory 302. Data from the LBFS buffer 310 is utilized by the floating gate coupling code encoder 306 to prevent forbidden write patterns from being written to the memory 302 by taking into account the data stored in a previously written page(s). The LBFS buffer 310 is one example of a way to store previously written data. In an alternate exemplary embodiment, a different storage mechanism and/or storage arrangement is used to store the previously written data. The codeword is output from the floating gate coupling code encoder 306 and input to the flash write processor 308 for writing the codeword to the memory 302. Among other tasks, the write processor computes and adds ECC parity bits, as required, to the codeword generated by the floating gate coupling code encoder.

The floating gate coupling encoder 306 generates a one or two dimensional bit pattern from which the data to be written can be recovered, such that the bit pattern does not contain a given set of one or two dimensional sub-patterns which have a high chance of inducing floating gate coupling errors (i.e., the forbidden write patterns). The resulting bit pattern, or codeword, is input to the conventional flash write processor 308 which writes the data to the physical flash memory 302.

As shown in FIG. 3, for reading the data, a codeword is fully or partially read from the memory device by the flash read processor 312. The read codeword, or bit-pattern is input to a floating gate coupling decoder 314 and a decompressor 316 to recover the data written into the memory 302 and to output it as read data.

Figure 4:
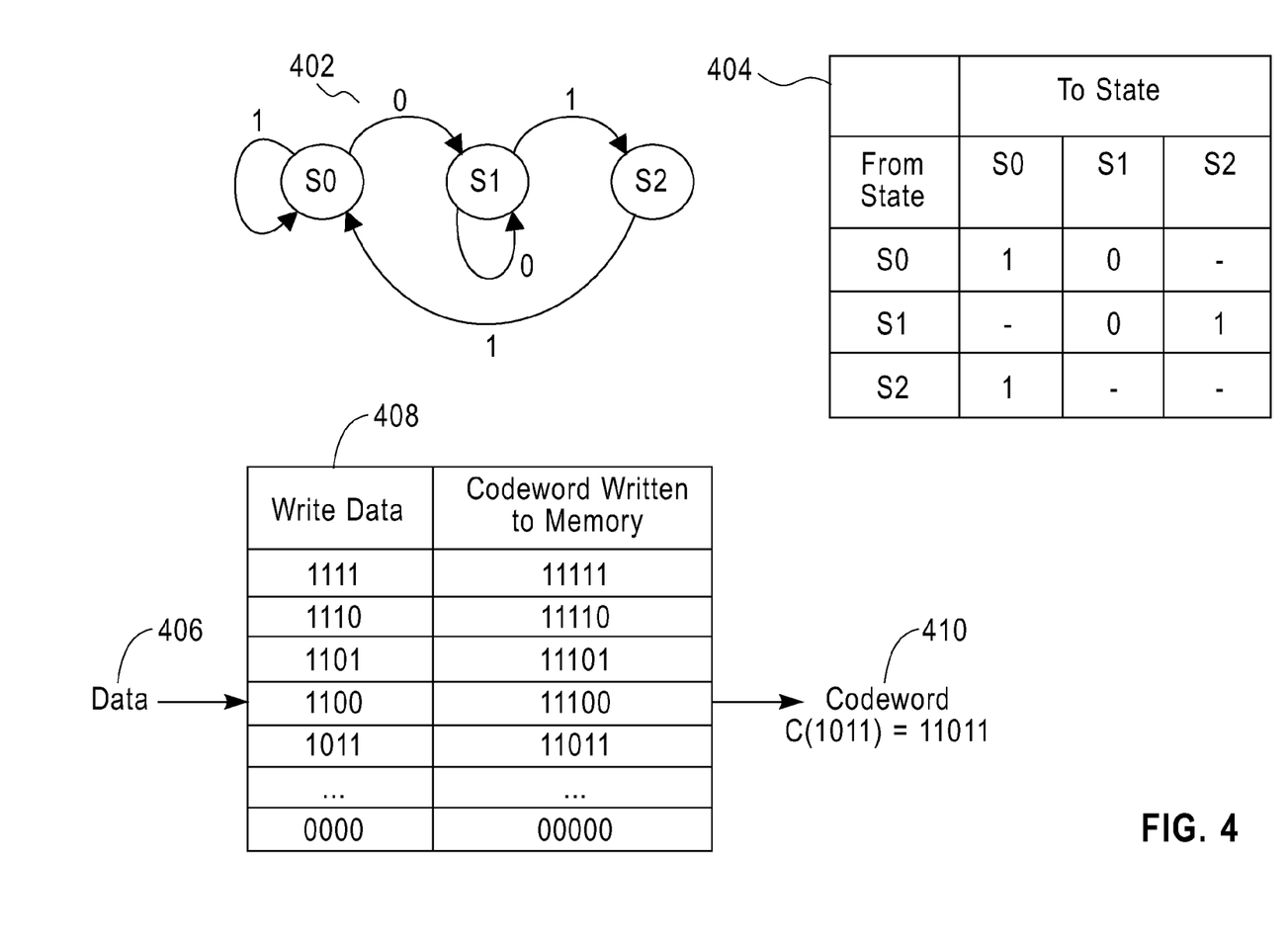
FIG. 4 illustrates a floating gate code encoder for a one dimensional constrained system for writing to a binary NAND flash memory that may be implemented by an exemplary embodiment.

FIG. 4 illustrates a one-dimensional floating gate coupling code for writing to a binary NAND flash memory that may be implemented by an exemplary embodiment. FIG. 4 shows a constrained one dimensional system for binary NAND, in which the pattern "010" (where 1 is the erased state) is a forbidden pattern within a single page. One dimensional bit patterns generated according to the graph 402 and the equivalent state table 404 all satisfy the constraint that the prohibited sub-pattern "010" does not occur in them. Referring back to FIG. 2, a forbidden pattern would be memory cell 206a in a programmed state, memory cell 206b in an erased state, and memory cell 206c in a programmed state.

Based on the state graph 402 or state table 404, a floating gate encoder can access a code table 408 in order to ensure that prohibited sub-patterns are not written within a group of memory cells. In the exemplary embodiment, a SLC flash memory has 5 cell (bit or symbol) pages, in which 4 bit (or 4 symbol) data will be written. The code table is indexed by the four-bit write data. The table is filled with 5 bit codewords (i.e., candidate codewords), which are formed by traversing the state graph 402 (or the state table 404). Codewords corresponding to different four-bit data are required to be different in order to ensure decodability. Thus, each codeword in the table is guaranteed to not contain the prohibited bit-pattern "010". Given a four-bit write data 406, the codeword 410 indexed by the write data is determined from the code table and is written to memory. Thus, for example, if the data is "1011", the corresponding codeword "11011" is selected and the selected codeword is written to memory. In general, because there are forbidden patterns, the read data will be expanded from four bits to more than four bits by the encoding process. The use of compression along with the code table can help to alleviate the amount of expansion that occurs, as will be described later. Also, in practice the data and flash page size will be much larger than the example just considered. In one embodiment, the flash page is partitioned into small (e.g. 5-bit) sub-pages, the data is partitioned into small blocks (e.g. 4 bit blocks), and the code-table based encoder is applied independently for each block-sub page pair. This approach reduces the computational complexity of coding. In this case the forbidden pattern is guaranteed to not occur in each sub-page (though it may occur across sub-page boundaries). Thus the frequency of the forbidden pattern can be significantly reduced.

Figure 5:
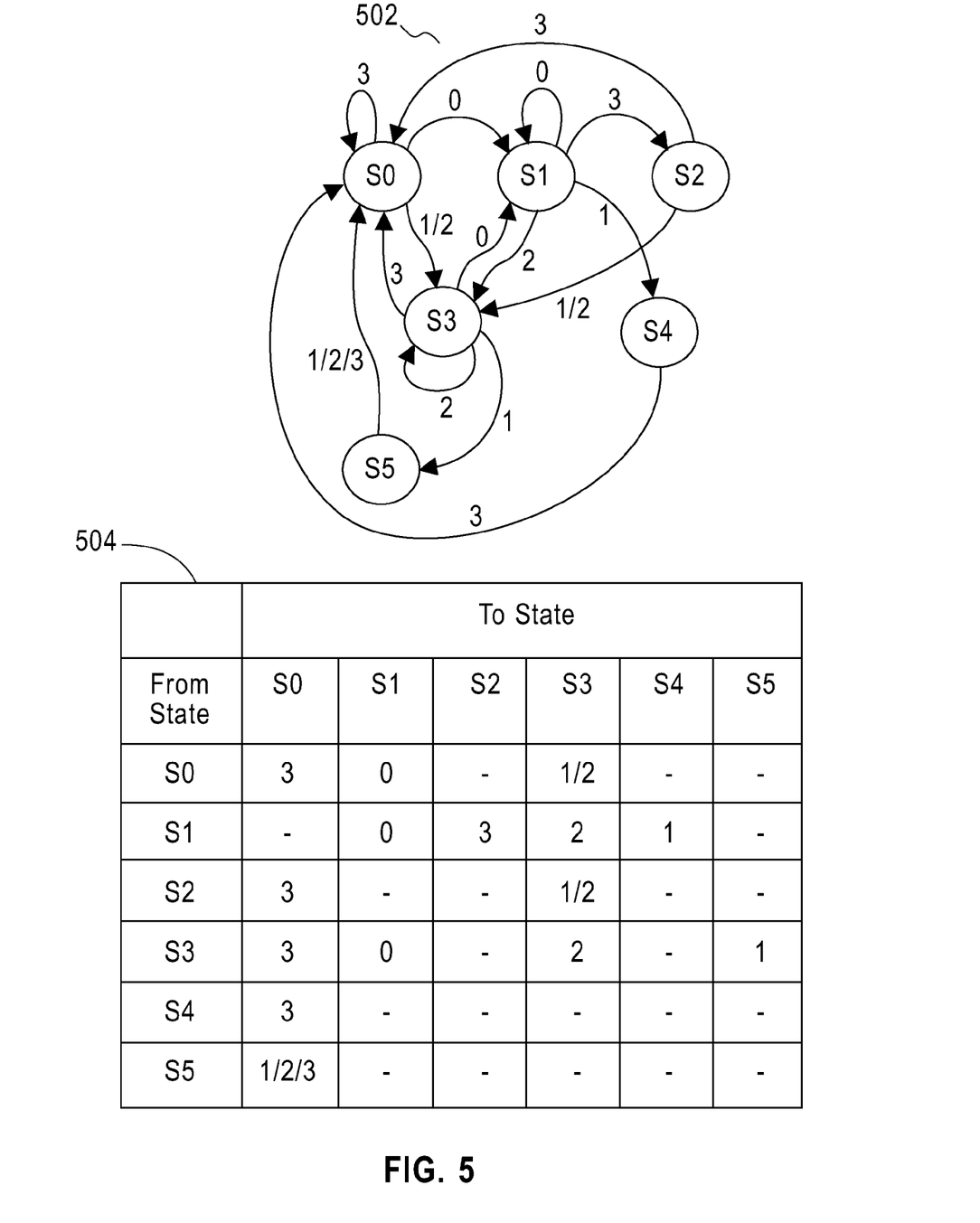
FIG. 5 illustrates a state graph for a two dimensional constrained system for writing to a binary NAND flash memory that may be implemented by an exemplary embodiment.

FIG. 5 illustrates the state graph and state table for two dimensional constrained system for writing to a binary NAND flash memory that may be implemented by an exemplary embodiment. FIG. 5 shows a two dimensional constrained system in which no five neighborhood of an erased memory cell has more than three programmed levels across a pair of pages. As used herein the term "five neighborhood" refers to the five closest cells in terms of Euclidean distance, on the same page and the three closest cells on the immediately succeeding page. The five neighborhood is an example of a spatial neighborhood of the page. For example, in FIG. 2, the five-neighborhood of cell 206e consists of the cells 206a, 206b, 206c, 206d and 206f. This can be extended to "n neighborhood" which refers to n close cells on the same page and neighboring pages. Two dimensional bit patterns generated according to the graph 502 and the equivalent state table 504 all satisfy the constraint that no more than three of memory cells in a five neighborhood of an erased memory cell are programmed. The constraint depicted in FIG. 5 spans two memory pages. Referring back to FIG. 2, a forbidden pattern would be memory cell 206e in an erased state, and more than three of memory cell 206a, memory cell 206b, memory cell 206c, memory cell 206d, and memory cell 206f being in a programmed state. Based on the state graph 502 or state table 504, a floating gate encoder can utilize a code table in order to ensure that prohibited sub-patterns are not written within a group of memory cells. The code table is indexed by the write data. The table is filled with codewords that are formed by traversing the state graph 502 (or the state table 504). Thus, the codewords in the table are consistent with the state graph. Codewords corresponding to different write data are required to be different in order to ensure that the data can be decoded properly. Thus, each codeword in the table is guaranteed to not contain the prohibited two-dimensional bit-pattern.

Figure 6:
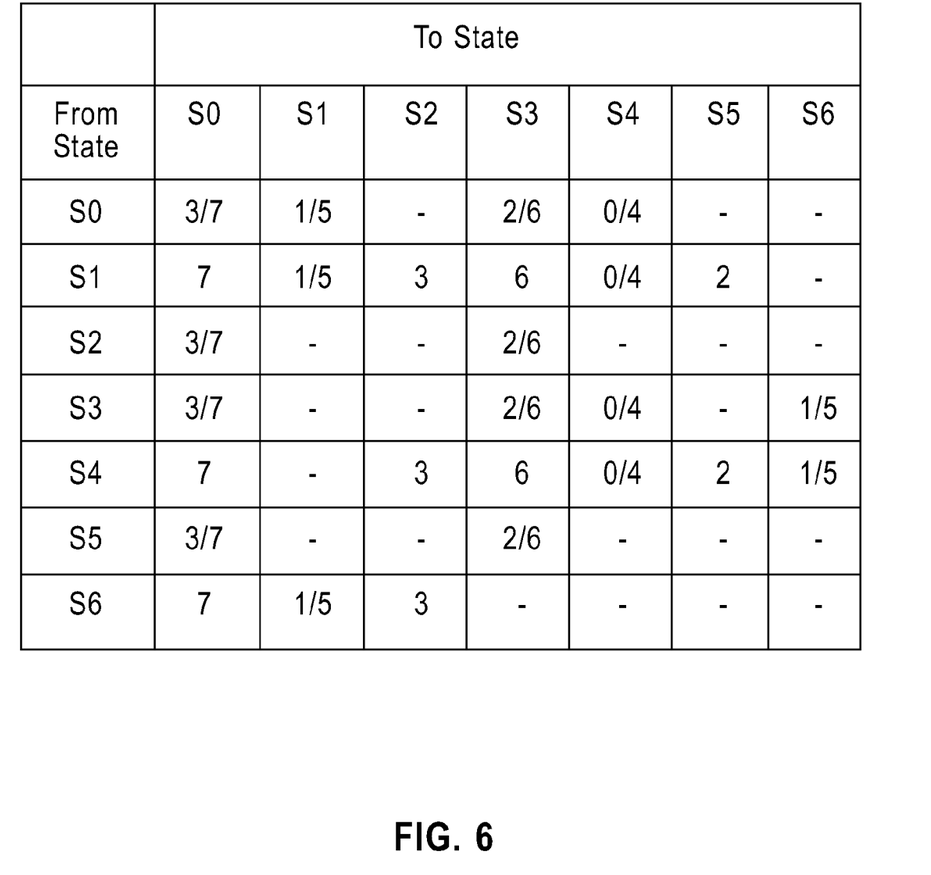
FIG. 6 illustrates a state graph for a two dimensional constrained system for writing to a binary NAND flash memory that may be implemented by an exemplary embodiment.

FIG. 6 illustrates the state table for a two dimensional constrained system for writing to a binary NAND flash memory that may be implemented by an exemplary embodiment. FIG. 6 shows a two dimensional constrained system in which the pattern [8 x0x; 010; x0x] is forbidden from occurring. This constraint spans three memory pages. Referring back to FIG. 2, a forbidden pattern would be memory cell 206e in an erased state, memory cell 206b in a programmed state, memory cell 206d in a programmed state, memory cell 206f in a programmed state, and memory cell 206h in a programmed state. Based on the state table, a floating gate encoder can utilize a code table in order to ensure that prohibited sub-patterns are not written within a group of memory cells. The code table is indexed by the write data. The table is filled with codewords which are formed by traversing the state table. Codewords corresponding to different write data are required to be different in order to ensure decodability. Thus, each codeword in the table is guaranteed to not contain the prohibited two-dimensional bit-pattern.

FIGS. 4-6 are example embodiments designed for binary (or SLC) flash arrays with up to three pages. Extending these principles to MLC flash and to a larger number of pages is straightforward and may be implemented by exemplary embodiments. It is also emphasized that the code-table based approach is only one method of generating the floating gate coupling code encoder from the given state tables. Other methods for generating constrained code encoders such as the use of state-splitting and IP algorithms, which are well-known in the literature, may also be used for this purpose.

Figure 7:
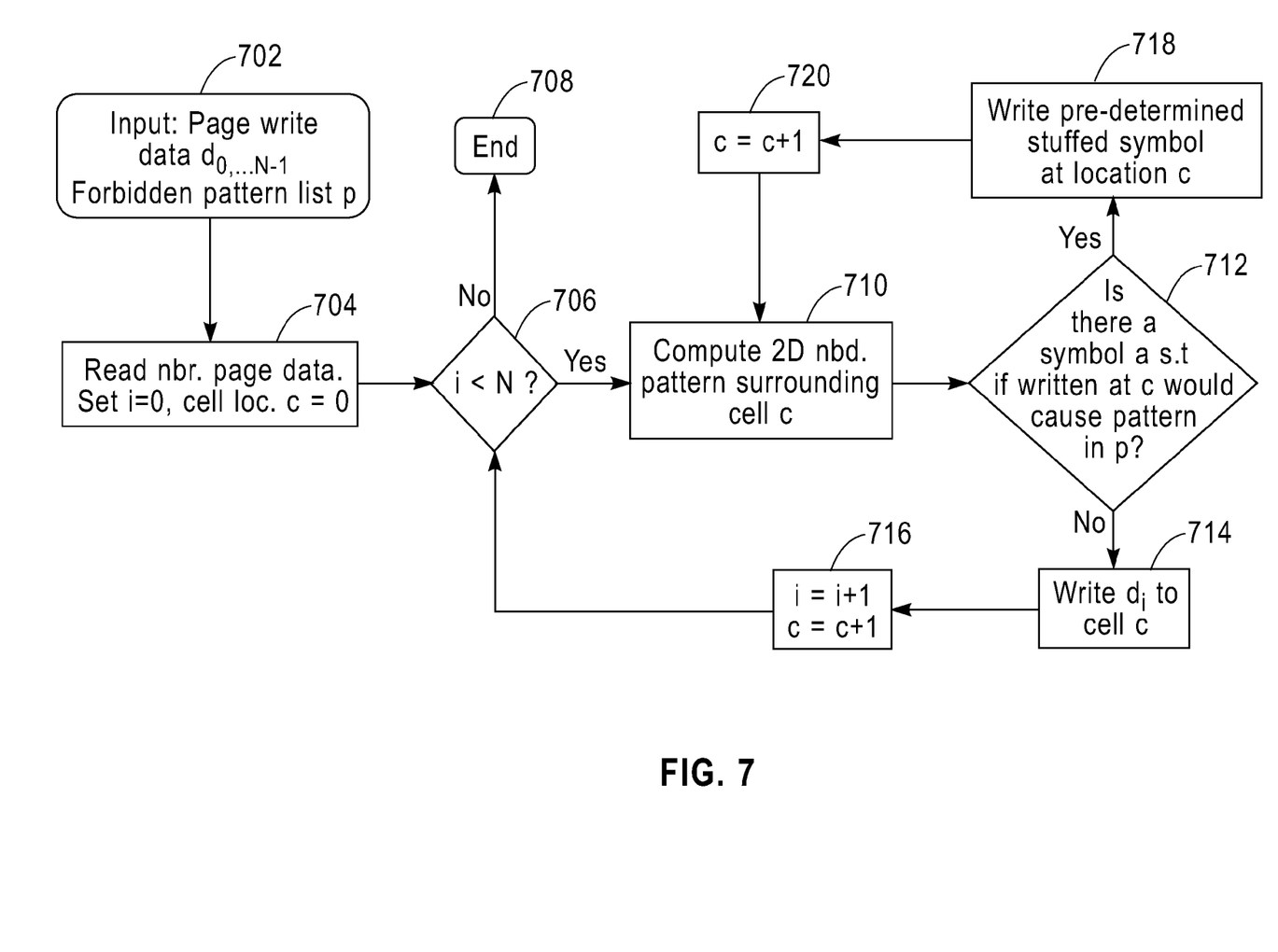
FIG. 7 is a block diagram of a write process to a NAND flash memory that may be implemented by an exemplary embodiment to reduce floating gate coupling by using bit stuffing to avoid prohibited patterns.

FIG. 7 is a block diagram of a write process to a NAND flash memory device that may be implemented by an exemplary embodiment to reduce floating gate coupling by using bit stuffing to avoid prohibited patterns. The process depicted in FIG. 7 writes two dimensional (2D) bit patterns to a NAND flash device such that certain 2D sub-patterns are prohibited. The processing depicted in FIG. 7 may be implemented by the floating gate coupling encoder 306. At block 702, inputs to the write process are received. The inputs include the write data having N bits (or symbols, for MLC Flash), and a list of the forbidden patterns, p. At block 704, the neighboring page data (e.g., the previously written codeword) is read from the LBFS buffer 310. Also at block 704, an index, i, into the write data bits is set to zero and an index into the codeword (or cell location), c, to be written to the memory is set to zero. At block 706, it is determined if there are more bits in the write data. If there are no more bits in the write data, then block 708 is performed and the process is ended.

If there are more bits in the write data, then block 710 is performed to compute the two dimensional neighborhood pattern surrounding bit c in the codeword. Both the prior page in the memory and the prior bits in the current page are known by the write process. For each cell location, c, to be written, the encoder 106 computes the 2D neighborhood of the location at block 710 and then determines, at block 712, if there exists any symbol which, when written to the current location, would cause a prohibited pattern from occurring. If such a symbol exits, then block 718 is performed and the encoder 106 writes a pre-determined symbol (referred to herein as a "stuffed bit" or "stuffed symbol") into location c of the codeword. The pre-determined symbol may be a function of the computed two-dimensional neighborhood or may be a pre-fixed symbol common for all neighborhoods. The index into the codeword is incremented at block 720 and processing continues at block 710. If, as determined at block 712, there is not a symbol which, when written to the current location, would cause a prohibited pattern from occurring, then processing continues at block 714. At block 714, the data bit at index i is store in location c of the codeword. At block 716, the index into the codeword and the index into the write data is incremented. Processing then continues at block 706; here the processing is continued until all the data in the write word has been written into the codeword. In this manner, the bit patterns specified in the list of forbidden patterns are prevented from occurring in the resulting codeword.

The process depicted in FIG. 7 can be easily inverted by the decoder 108 to recover the data. An advantage of the process depicted in FIG. 7 is that it allows a simple, one dimensional sequential method for writing bit patterns which satisfy two dimensional constraints. It is noted that the embodiment depicted in FIG. 7 is just one example of how the constrained systems such as those shown in FIGS. 4-6 and their extensions can be implemented. Other constrained encoders such as tagged-block encoders, encoders obtained by state-splitting, etc. can also be used to implement an embodiment of the encoder 106.

One issue that arises with the encoder processing depicted in FIG. 7 is that it will increase (assuming that prohibited specified bit patterns are located) the number of memory cells required to write a given data pattern. This is because avoiding prohibited sub-patterns requires the use of additional data bits, the stuffed bits, which are not present in the original write data. This can prove problematic, since the expansion in data size may not be easy to predict, and flash memory pages are typically of a fixed size. One way to alleviate the increase in the number of bits in the resulting codeword is to compress the write data using a compressor 304 before inputting it to the floating gate coupling encoder 306.

Figure 8:
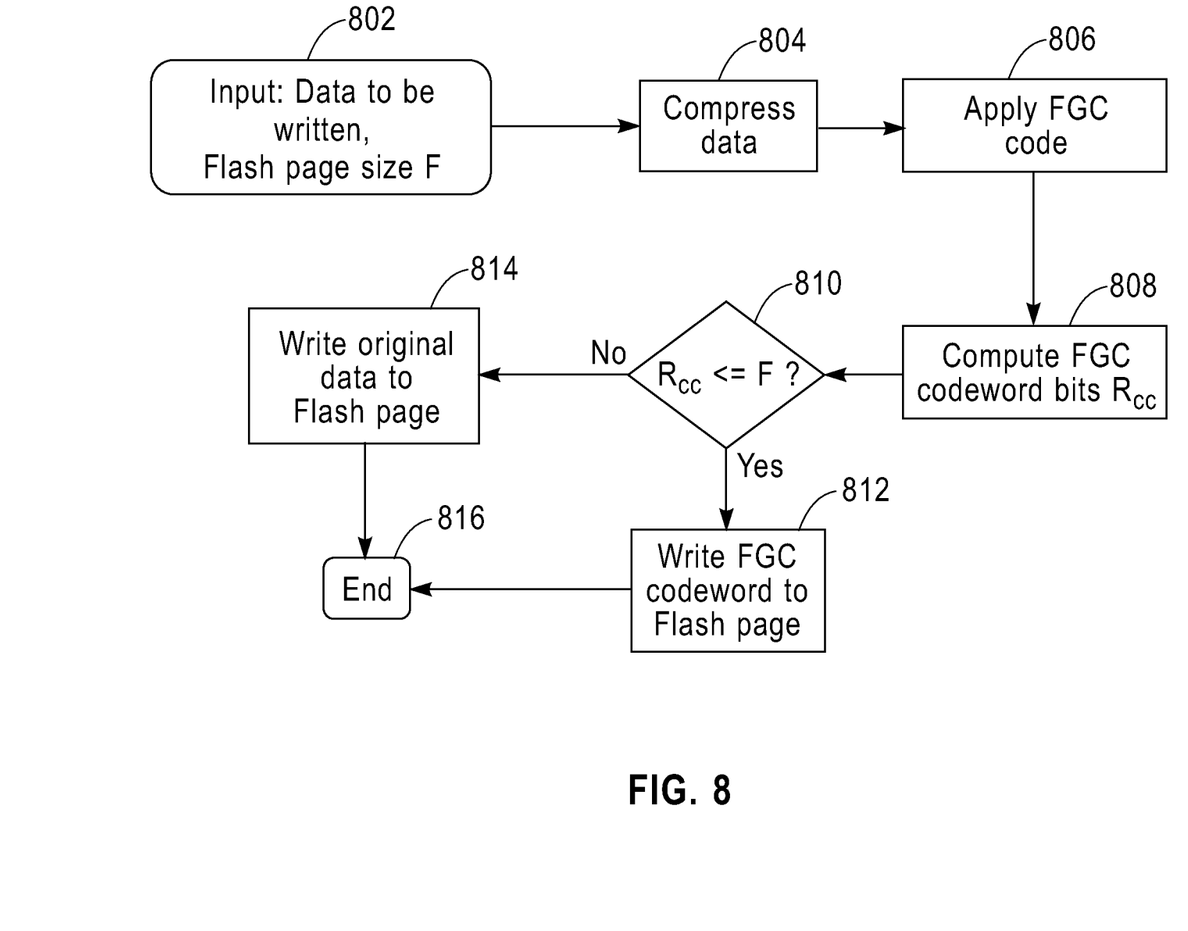
FIG. 8 is a block diagram of a write process to a NAND flash memory that may be implemented by an alternate exemplary embodiment to reduce floating gate coupling.

In an exemplary embodiment, if the codeword output from the encoder 106 is equal to or less than the page size then the codeword is written to the memory. Alternatively, if the resulting codeword is longer than the page size, then the original write data is written. An example of this process is depicted in FIG. 8. FIG. 8 is a block diagram of a write process to a NAND flash memory that may be implemented by an encoder 106 in an alternate exemplary embodiment to reduce floating gate coupling. The process depicted in FIG. 8 adaptively employs constrained coding to mitigate floating gate coupling while ensuring that the data written into memory (the codeword) is not so large as to overflow a page.

As depicted in FIG. 8, the data to be written and the flash memory page size, F, is input to the encoder 106. The encoder 106 compresses the data using a lossless compression method at block 804 and then applies floating gate coupling encoding at block 806 (e.g., the processing depicted in FIG. 7) to generate a codeword. At block 808, the length of the codeword is computed (e.g., the number of bits, number of cells, number of symbols). The length of the codeword is compared to the length of the memory page at block 810. If the length of the codeword is less or equal to the length of the memory page, then block 812 is performed and the codeword is written to the flash memory page. If the length of the codeword is greater than the length of the memory page, then block 814 is performed and the original write data is written to the memory page. If the length of the codeword is generally less than or equal to the page length, then the process described in FIG. 8 can be used to guarantee that the data can be written without overflowing, while also providing a significant increase in reliability due to decreased floating gate coupling. In an exemplary embodiment, the shared data 110 stores an indicator that is used by the decoder 108 to determine whether the codeword, the original write data, or the compressed write data was written to the memory page.

In an alternate embodiment the encoder can use one of multiple pre-specified floating gate coupling codes, each of which prevents or reduces the frequency of occurrence of a different set of bit-patterns. As an example, the encoder can use codes based on any of the three state tables shown in FIGS. 4-6. In this embodiment, the encoder selects a code to use in response to the number of bits of write data, possibly after compression. The code is selected such that the resultant codeword has lesser than a pre-specified maximum number of bits (which may, for example, be equal to the page length). In general, the lesser the bits of write data, the larger is the set of bit patterns which may be prohibited by appropriate selection of the code.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire line, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A computer implemented method for storing data comprising:
   receiving write data to be written to a flash memory device;
   selecting a codeword in response to the write data, the codeword selected to reduce floating gate coupling in the flash memory device by preventing specified symbol patterns from occurring in the codeword, the selecting further comprising:
      reading neighboring data comprising a previously written codeword;
      computing a two-dimensional codeword for each cell location of the codeword relative to the previously written codeword;
      comparing the two-dimensional code word for each cell location of the codeword to the specified symbol patterns; and
      writing a pre-determined symbol into a cell location of the codeword based on determining that the two-dimensional code word for the cell location matches one of the specified symbol patterns; and
   writing the codeword to the flash memory device.

2. The method of claim 1, wherein the flash memory device comprises a plurality of pages and the codeword is written to a single page in the flash memory device.

3. The method of claim 1, wherein the flash memory device comprises a plurality of pages and the codeword is written to at least two pages in the flash memory device.

4. The method of claim 1, further comprising performing compression on the write data prior to selecting the codeword.

5. The method of claim 1, wherein the selected codeword comprises the write data and additional pre-determined symbols.

6. The method of claim 1, wherein the selecting a codeword includes accessing a table to convert the write data into the codeword.

7. The method of claim 1, wherein the flash memory device comprises a plurality of pages, the specified symbol patterns span a plurality of pages, and the selecting a codeword includes accessing a previously written page.

8. The method of claim 1, wherein the flash memory device is a not-and (NAND) flash memory device.

9. The method of claim 1, wherein a frequency of occurrence of the specified symbol patterns in the flash memory device is reduced.

10. The method of claim 1, wherein the specified symbol patterns are selected in response to a total number of symbols in the write data.

11. A computer implemented method for storing data comprising:
   receiving write data to be written to a flash memory device, the flash memory device comprising a plurality of pages characterized by a page length;

compressing the write data, the compressing resulting in compressed write data;

selecting a codeword in response to the compressed write data, the codeword selected to reduce floating gate coupling in the flash memory device by preventing specified symbol patterns from occurring in the codeword;

determining a length of the codeword; writing the codeword to a page in the flash memory device in response to the length of the codeword being less than or equal to the page length; and in response to the length of the codeword being greater than the page length, writing to the flash memory device one of the write data and the compressed write data instead of the codeword.

12. The method of claim 11, wherein the selected codeword comprises the compressed write data and a pre-determined symbol at a symbol location, and a value of the pre-determined symbol is selected in response to symbol values in a spatial neighborhood of the page.

13. The method of claim 11, wherein the selecting a codeword includes accessing a table to convert the compressed write data into the codeword, and the table includes one or more candidate codewords that are consistent with a pre-determined state graph.

14. The method of claim 11, wherein the specified symbol patterns span two or more of the plurality of pages in the flash memory device, and the selecting a codeword includes accessing a previously written page.

15. The method of claim 11, wherein the flash memory device is a not-and (NAND) flash memory device.

16. The method of claim 11, wherein a frequency of occurrence of the specified symbol patterns in the flash memory device is reduced.

17. The method of claim 11, wherein the specified symbol patterns are selected in response to a total number of symbols in the compressed write data.

18. A system comprising:

a receiver for receiving write data to be written to a flash memory device;

an encoder for selecting a codeword in response to the write data, the codeword selected to reduce floating gate coupling in the flash memory device by preventing specified symbol patterns from occurring in the codeword, the selecting further comprising:

reading neighboring data comprising a previously written codeword;

computing a two-dimensional codeword for each cell location of the codeword relative to the previously written codeword;

comparing the two-dimensional code word for each cell location of the codeword to the specified symbol patterns; and writing a pre-determined symbol into a cell location of the codeword based on determining that the two-dimensional code word for the cell location matches one of the specified symbol patterns; and a flash write processor for writing the codeword to the flash memory device.

19. The system of claim 18 further comprising a compressor for compressing the write data prior to selecting the codeword.

20. The system of claim 18, wherein the flash memory device is a single level cell not-and (NAND) flash memory device.

21. The system of claim 18, wherein the flash memory device is a multi-level cell NAND flash memory device.

22. The system of claim 18, wherein the flash memory device comprises a plurality of pages, the specified symbol patterns span a plurality of pages, and the selecting a codeword includes accessing a previously written page.

* * * * *